(12) United States Patent
Lin et al.

(10) Patent No.: US 10,586,831 B1
(45) Date of Patent: Mar. 10, 2020

(54) LIGHT EMITTING DIODE MEMORY

(71) Applicant: OPTO TECH CORPORATION, Hsinchu (TW)

(72) Inventors: Jun-Jie Lin, Changhua County (TW); Yi-Lin Ho, Taipei (TW); Lung-Han Peng, Taipei (TW)

(73) Assignee: OPTO TECH CORPORATION, Hsinchu (TW)

( * ) Notice: Subject to any disclaimer, the term of this patent is extended or adjusted under 35 U.S.C. 154(b) by 0 days.

(21) Appl. No.: 16/253,932

(22) Filed: Jan. 22, 2019

(30) Foreign Application Priority Data

Oct. 9, 2018 (TW) .............................. 107135650 A

(51) Int. Cl.
*H01L 27/24* (2006.01)
*G11C 13/00* (2006.01)
*H01L 45/00* (2006.01)

(52) U.S. Cl.
CPC ........ *H01L 27/2409* (2013.01); *G11C 13/004* (2013.01); *H01L 45/1213* (2013.01); *H01L 45/1253* (2013.01); *H01L 45/146* (2013.01); *H01L 45/147* (2013.01)

(58) Field of Classification Search
CPC ............. H01L 27/2409; H01L 45/1253; H01L 45/1213; H01L 45/146
See application file for complete search history.

(56) References Cited

U.S. PATENT DOCUMENTS 10,050,156 B1  8/2018  Chang et al.
2016/0155940 A1*  6/2016  Chen .................... H01L 45/085
                                            257/4

FOREIGN PATENT DOCUMENTS

TW    201517338    5/2015
TW    201740509    11/2017
TW    I632646      8/2018

OTHER PUBLICATIONS

Taiwan Intellectual Property Office, "Offce Action", dated Feb. 20, 2019.

* cited by examiner

*Primary Examiner* — Allison Bernstein
(74) *Attorney, Agent, or Firm* — WPAT, PC

(57) ABSTRACT

A light emitting diode memory includes a substrate, a tunneling structure, a current spreading layer, a first electrode layer and a second electrode layer. The tunneling structure is formed on the substrate. The tunneling structure includes first, second and third material layers. The current spreading layer is formed on the tunneling structure. The first electrode layer is formed on the substrate. The second electrode layer is formed on the current spreading layer. When a bias voltage applied to the first electrode layer and the second electrode layer is higher than a reset voltage, the light emitting diode memory is in a reset state. When the bias voltage is lower than a set voltage, the light emitting diode memory is in a set state. When the bias voltage is higher than a turn-on voltage, the light emitting diode memory emits a light beam.

10 Claims, 10 Drawing Sheets

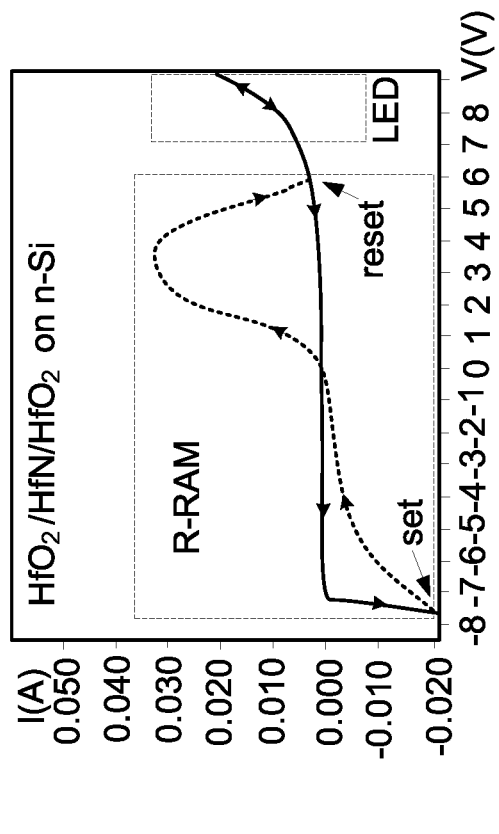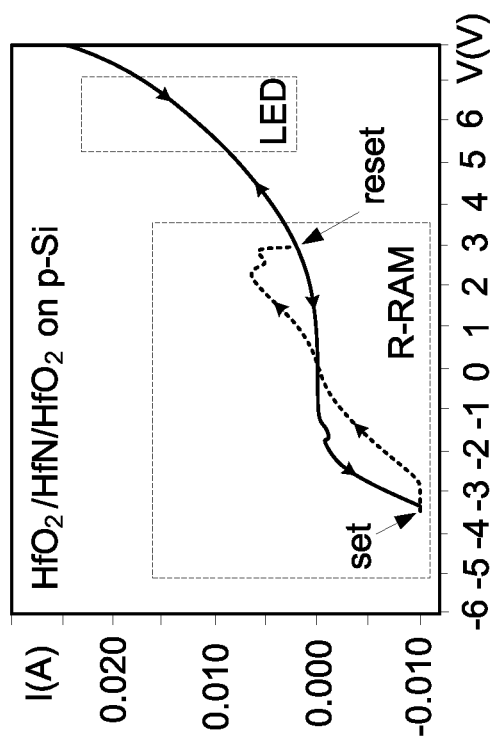
FIG. 5A
FIG. 5B
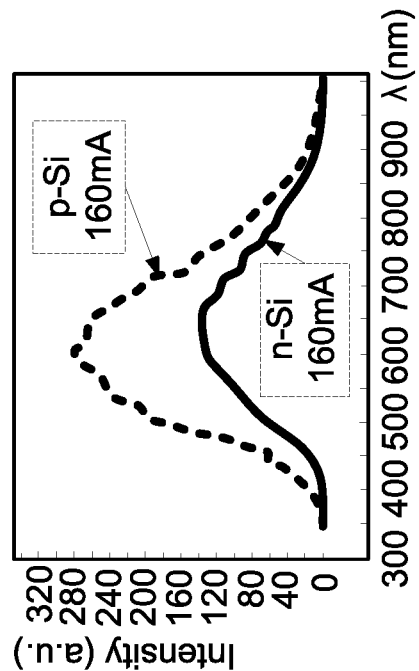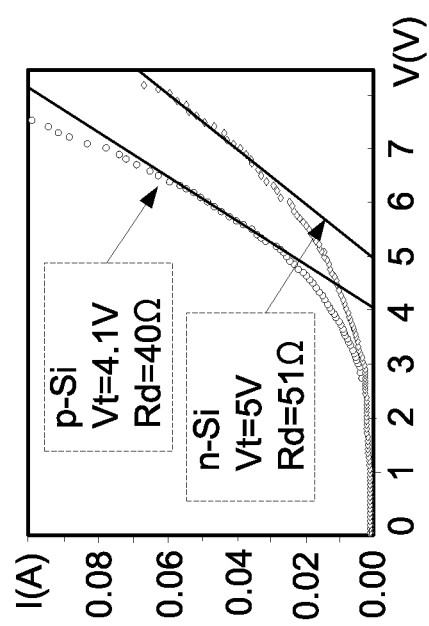
FIG. 5C
FIG. 5D

LIGHT EMITTING DIODE MEMORY

This application claims the benefit of Taiwan Patent Application No. 107135650, filed Oct. 9, 2018, the subject matter of which is incorporated herein by reference.

FIELD OF THE INVENTION

The present invention relates to a memory, and more particularly to a resistive memory element with a diode structure.

BACKGROUND OF THE INVENTION

A resistive random-access memory (RRAM) is one kind of non-volatile memory. Since the resistive random-access memories have higher accessing speeds, simpler structures, non-volatile properties and higher reliability, the manufacturers of the memories pay much attention to the development of the resistive random-access memories. Moreover, as the semiconducting technology is increasingly developed, the 3D resistive memory with a high-density design becomes a critical research issue.

In the resistive memory, each memory cell comprises a resistive memory element. The resistive memory element may be programmed to different storage states. For example, the storage states include a set state and a reset state.

For example, when a set voltage is applied to the two terminals of the resistive memory element, the resistive memory element is in the set state corresponding to a low resistance value. Whereas, when a reset voltage is applied to the two terminals of the resistive memory element, the resistive memory element is in the reset state corresponding to a high resistance value.

For example, a resistive memory element is disclosed in U.S. Pat. No. 10,050,156. The resistive memory element a P-type layer, a tunneling structure and an N-type layer. If the bias voltage between the P-type layer and the N-type layer is higher than the reset voltage, the resistive memory element is in the reset state. Whereas, if the bias voltage between the P-type layer and the N-type layer is lower than the reset voltage, the resistive memory element is in the set state.

SUMMARY OF THE INVENTION

An object of the present invention provides a light emitting diode memory. The light emitting diode memory is used as a resistive random-access memory (RRAM). A novel material is applied to the light emitting diode memory. When the resistive memory element is forwardly biased, the light emitting diode memory is in a reset state. When the resistive memory element is reversely biased, the light emitting diode memory is in a set state. In case that the forward bias voltage applied to the light emitting diode memory is higher than a turn-on voltage, the light emitting diode memory emits a light beam.

An embodiment of the present invention provides a light emitting diode memory. The light emitting diode memory includes a substrate, a tunneling structure, a current spreading layer, a first electrode layer and a second electrode layer. The tunneling structure is formed on the substrate. The tunneling structure is a stack structure including a first material layer, a second material layer and a third material layer. The current spreading layer is formed on the tunneling structure. The first electrode layer is formed on the substrate. The second electrode layer is formed on the current spreading layer. When a bias voltage applied to the first electrode layer and the second electrode layer is higher than a reset voltage, the light emitting diode memory is in a reset state. When the bias voltage is lower than a set voltage, the light emitting diode memory is in a set state. When the bias voltage is higher than a turn-on voltage, the light emitting diode memory emits a light beam.

Another embodiment of the present invention provides a light emitting diode memory. The light emitting diode memory includes a substrate, a tunneling structure, a current spreading layer, a first electrode layer and a second electrode layer. The tunneling structure is formed on the substrate. The tunneling structure is a stack structure including a first material layer, a second material layer, a third material layer, a fourth material layer and a fifth material layer. The current spreading layer is formed on the tunneling structure. The first electrode layer is formed on the substrate. The second electrode layer is formed on the current spreading layer. When a bias voltage applied to the first electrode layer and the second electrode layer is higher than a reset voltage, the light emitting diode memory is in a reset state. When the bias voltage is lower than a set voltage, the light emitting diode memory is in a set state. When the bias voltage is higher than a turn-on voltage, the light emitting diode memory emits a light beam.

A further embodiment of the present invention provides a light emitting diode memory. The light emitting diode memory includes a substrate, an active layer, a current spreading layer, a first electrode layer and a second electrode layer. The active layer is a zinc oxide layer. The current spreading layer is formed on the active layer. The first electrode layer is formed on the substrate. The second electrode layer is formed on the current spreading layer. When a bias voltage applied to the first electrode layer and the second electrode layer is higher than a reset voltage, the light emitting diode memory is in a reset state. When the bias voltage is lower than a set voltage, the light emitting diode memory is in a set state. When the bias voltage is higher than a turn-on voltage, the light emitting diode memory emits a light beam.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIGS. 5A-5D are plots illustrating the characteristic curves of two light emitting diode memories according to the first embodiment of the present invention, in which the tunneling structure is a stack structure of hafnium oxide ($HFO_2$)/hafnium nitride (HfN)/hafnium oxide ($HFO_2$) and the substrate is an n-type substrate or a p-type substrate;

DETAILED DESCRIPTION OF PREFERRED EMBODIMENTS

Figure 1:
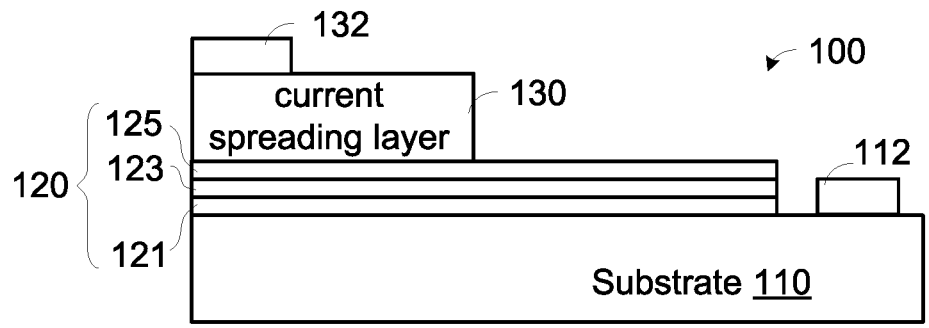
FIG. 1 is a schematic cross-sectional view illustrating a light emitting diode memory according to a first embodiment of the present invention.

FIG. 1 is a schematic cross-sectional view illustrating a light emitting diode memory according to a first embodiment of the present invention. The light emitting diode memory 100 comprises a substrate 110, a tunneling structure 120 and a current spreading layer 130. The light emitting diode memory 100 further comprises electrode layers 112 and 132. The electrode layer 112 and the substrate 110 are in ohmic contact with each other. The electrode layer 132 and the current spreading layer 130 are in ohmic contact with each other.

The tunneling structure 120 is a stack structure comprising plural material layers. For example, the tunneling structure 120 is a stack structure comprising a first material layer 121, a second material layer 123 and a third material layer 125. The first material layer 121 and the third material layer 125 are barrier layers. The second material layer 123 is a quantum well layer.

In this embodiment, the substrate 110 is an n-type substrate or a p-type substrate. Moreover, the materials of the first material layer 121, the second material layer 123 and the third material layer 125 may be different.

FIGS. 2A-2F are plots illustrating the characteristic curves of two light emitting diode memories according to the first embodiment of the present invention, in which the tunneling structure is a stack structure of hafnium oxide ($HFO_2$)/zinc oxide (ZnO)/hafnium oxide ($HFO_2$) and the substrate is an n-type substrate or a p-type substrate.

Figure 2A:
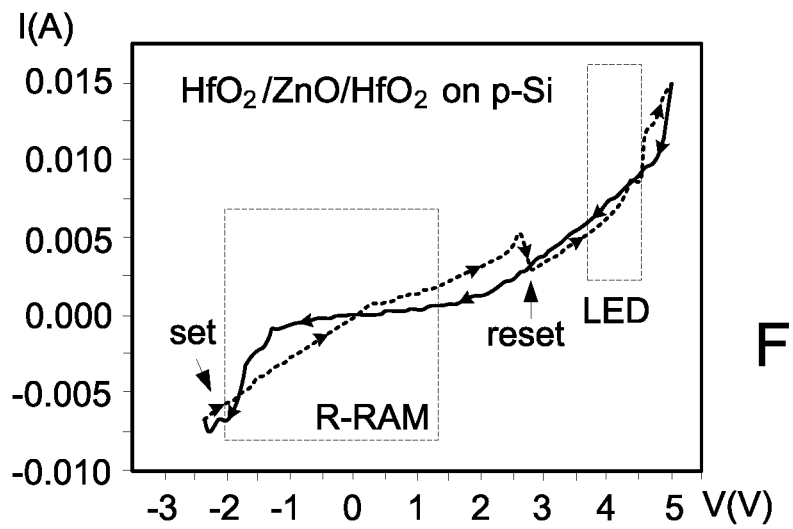
FIGS. 2A-2F are plots illustrating the characteristic curves of two light emitting diode memories according to the first embodiment of the present invention, in which the tunneling structure is a stack structure of hafnium oxide ($HFO_2$)/zinc oxide (ZnO)/hafnium oxide ($HFO_2$) and the substrate is an n-type substrate or a p-type substrate.

FIG. 2A schematically illustrates the relationship between the bias voltages and the currents of the first type light emitting diode memory. The tunneling structure 120 is a stack structure comprising the first material layer 121, the second material layer 123 and the third material layer 125. The first material layer 121 is a hafnium oxide ($HFO_2$) layer. The second material layer 123 is a zinc oxide (ZnO) layer. The third material layer 125 is a hafnium oxide ($HFO_2$) layer. The tunneling structure 120 is formed on a p-type substrate 110 along a (100) direction. The thicknesses of the three material layers 121, 123 and 125 are 2 nm, 6 nm and 2 nm, respectively. The current spreading layer 130 is an n-type indium tin oxide (n-ITO) layer.

In case that the light emitting diode memory 100 is forwardly biased, the bias voltage is positive. Moreover, the voltage received by the electrode layer 112 is higher than the voltage received by the electrode layer 132. Whereas, in case that light emitting diode memory 100 is reversely biased, the bias voltage is negative. Moreover, the voltage received by the electrode layer 112 is lower than the voltage received by the electrode layer 132.

Moreover, the light emitting diode memory 100 is set according to the reverse bias voltage, and the light emitting diode memory 100 is reset according to the forward bias voltage.

Please refer to FIG. 2A. When the light emitting diode memory 100 is in the reset state corresponding to the high resistance value and the bias voltage is changed between 0 and −2.5V, the solid line of FIG. 2A indicates the characteristic curve of the light emitting diode memory 100.

When the bias voltage is lower than −2.5V, the light emitting diode memory 100 is set to be in a set state corresponding to the low resistance value.

When the light emitting diode memory 100 is in the set state and the bias voltage is gradually increased from −2.5V, the dotted line of FIG. 2A indicates the characteristic curve of the light emitting diode memory 100.

When the bias voltage is increased to +2.7V, the light emitting diode memory 100 is turned on to emit a light beam. When the bias voltage is higher than +3V, the light emitting diode memory 100 is reset to be in the reset state corresponding to the high resistance value.

When the bias voltage is decreased from +5V to 0V, the characteristic curve of the light emitting diode memory 100 indicates that the light emitting diode memory 100 is maintained in the reset state corresponding to the high resistance value (see the solid line).

Similarly, in case that the bias voltage is decreased to be lower than −2.5V again, the light emitting diode memory 100 is changed to the set state. That is, when the bias voltage is swept between −2.5V and +3V, the light emitting diode memory 100 is alternately in the set state and the reset state. In this embodiment, the reverse bias voltage of −2.5V is a set voltage, and the forward bias voltage of +3V is a reset voltage.

As shown in FIG. 2A, the light emitting diode memory 100 has different resistance values in the voltage range between the −2.5V and +3V according to the states of the light emitting diode memory 100. Consequently, the light emitting diode memory 100 in the voltage range between the −2.5V and +3V may be used as a resistive random-access memory (RRAM). In addition, the light emitting diode memory 100 over +2.7V may be used as a light emitting diode (LED).

As mentioned above, the light emitting diode memory 100 has different resistance values in the voltage range between the −2.5V and +3V. In an embodiment, a read voltage is provided as a bias voltage. The storage state of the light emitting diode memory 100 is determined as the set state or the reset state according to the magnitude of the current generated by the light emitting diode memory 100.

The read voltage is in the range between −2V and +3V. For example, the read voltage Vread is +0.01V.

For example, the read voltage of +0.01V is provided to the light emitting diode memory 100 as the bias voltage. In case that the current generated by the light emitting diode memory 100 is higher than a reference current, the light emitting diode memory 100 is in the set state. In case that the current generated by the light emitting diode memory 100 is lower than the reference current, the light emitting diode memory 100 is in the reset state.

Figure 2B:
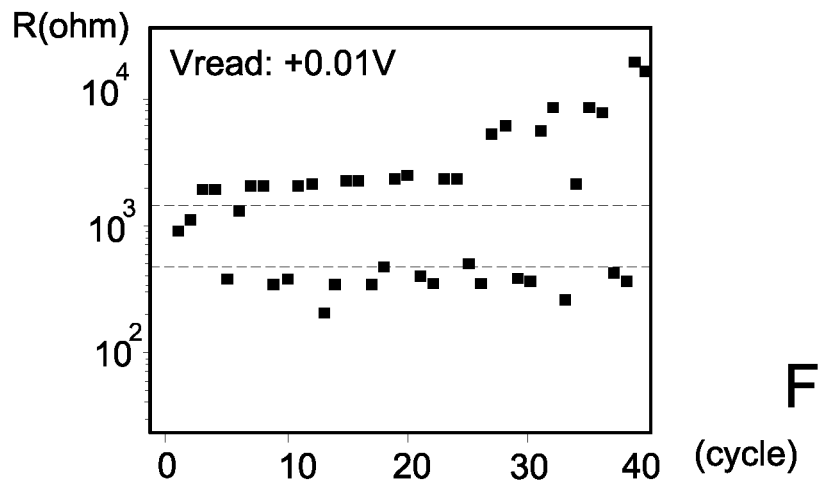

FIG. 2B is a plot illustrating the relationship between the resistance values and the sweeping cycles for the first type light emitting diode memory. Even if the number of cycles of resetting and setting light emitting diode memory 100 is large, the set state and the reset state of the light emitting diode memory 100 can be judged according to the resistance value of the set state and the reset state. As shown in FIG. 2B, the ratio of the resistance value in the reset state to the resistance value in the reset state is larger than about 10.

Figure 2C:
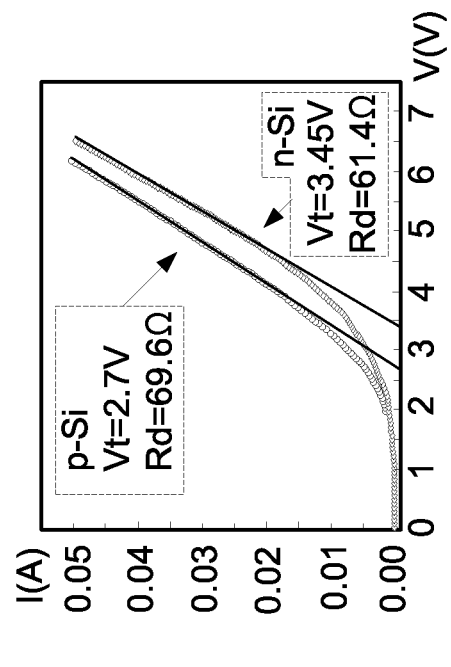

FIG. 2C schematically illustrates the relationship between the bias voltages and the currents of the second type light emitting diode memory. The tunneling structure 120 is a stack structure comprising the first material layer 121, the second material layer 123 and the third material layer 125. The first material layer 121 is a hafnium oxide ($HFO_2$) layer. The second material layer 123 is a zinc oxide (ZnO) layer. The third material layer 125 is a hafnium oxide ($HFO_2$) layer. The tunneling structure 120 is formed on an n-type substrate along a (111) direction. The thicknesses of the three material layers 121, 123 and 125 are 2 nm, 6 nm and 2 nm, respectively. The current spreading layer 130 is an n-type indium tin oxide (n-ITO) layer.

During the operation of the second type light emitting diode memory, the contact region between the tunneling structure 120 and the n-type substrate 110 is formed as an inversion layer. Consequently, the n-type substrate 110 has the p-type property. In case that the light emitting diode memory 100 is forwardly biased, the bias voltage is positive. Moreover, the voltage received by the electrode layer 112 is higher than the voltage received by the electrode layer 132. Whereas, in case that light emitting diode memory 100 is reversely biased, the bias voltage is negative. Moreover, the voltage received by the electrode layer 112 is lower than the voltage received by the electrode layer 132.

Please refer to FIG. 2C. When the light emitting diode memory 100 is in the reset state corresponding to the high resistance value and the bias voltage is changed between 0 and −4.5V, the solid line of FIG. 2C indicates the characteristic curve of the light emitting diode memory 100. When the bias voltage is lower than −4.5V, the light emitting diode memory 100 is set to be in a set state corresponding to the low resistance value.

When the light emitting diode memory 100 is in the set state and the bias voltage is gradually increased from −4.5V, the dotted line of FIG. 2C indicates the characteristic curve of the light emitting diode memory 100.

When the bias voltage is increased to be higher than +3.45V, the light emitting diode memory 100 is turned on to emit a light beam. When the bias voltage is higher than +4.5V, the light emitting diode memory 100 is reset to be in the reset state corresponding to the high resistance value.

When the bias voltage is decreased from +5V to 0V, the characteristic curve of the light emitting diode memory 100 indicates that the light emitting diode memory 100 is maintained in the reset state corresponding to the high resistance value (see the solid line).

Similarly, in case that the bias voltage is decreased to be lower than −4.5V again, the light emitting diode memory 100 is changed to the set state. That is, when the bias voltage is swept between −4.5V and +4.5V, the light emitting diode memory 100 is alternately in the set state and the reset state. In this embodiment, the reverse bias voltage of −4.5V is a set voltage, and the forward bias voltage of +4.5V is a reset voltage.

As shown in FIG. 2C, the light emitting diode memory 100 has different resistance values in the voltage range between the −4.5V and +4.5V according to the states of the light emitting diode memory 100. Consequently, the light emitting diode memory 100 in the voltage range between the −4.5V and +4.5V may be used as a resistive random-access memory (RRAM). In addition, the light emitting diode memory 100 over +3.45V may be used as a light emitting diode (LED). The read voltage is in the range between −4.5V and +4.5V. For example, the read voltage Vread is +0.01V.

Figure 2E:
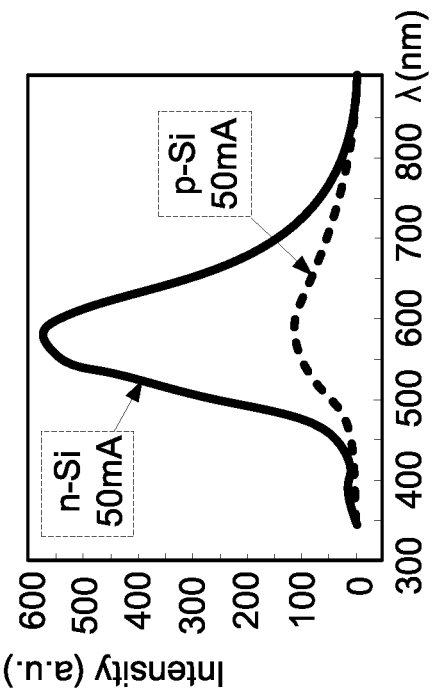
Figure 2D:
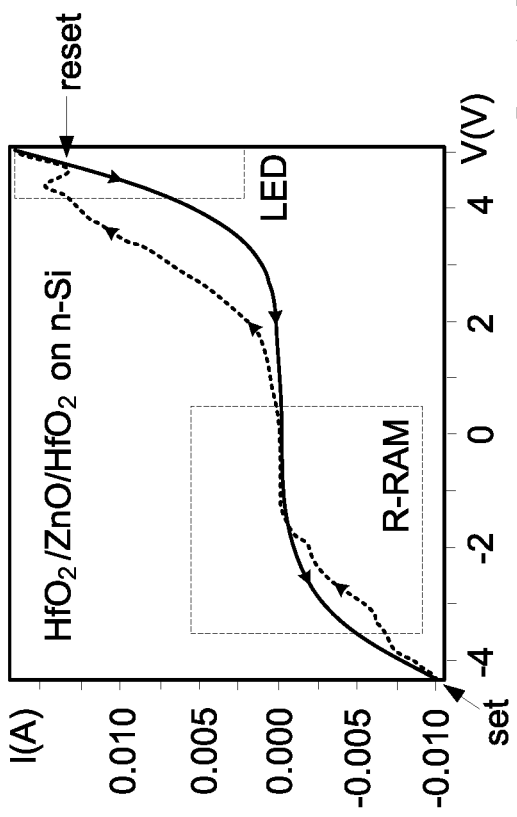

FIG. 2D is a plot illustrating the relationship between the resistance values and the sweeping cycles for the second type light emitting diode memory. Even if the number of cycles of resetting and setting light emitting diode memory 100 is large, the set state and the reset state of the light emitting diode memory 100 can be judged according to the resistance value of the set state and the reset state. As shown in FIG. 2D, the ratio of the resistance value in the reset state to the resistance value in the reset state is larger than about 10.

FIG. 2E is a plot illustrating the relationship between the current and the voltage (I-V) for the first type light emitting diode memory and the second type light emitting diode memory. The turn-on voltage Vt of the first type light emitting diode memory (i.e., having the p-type substrate) is about 2.7V, and the resistance value Rd of the first type light emitting diode memory is about 69.6 ohms. The turn-on voltage Vt of the second type light emitting diode memory (i.e., having the n-type substrate) is about 3.45V, and the resistance value Rd of the second type light emitting diode memory is about 61.4 ohms.

Figure 2F:
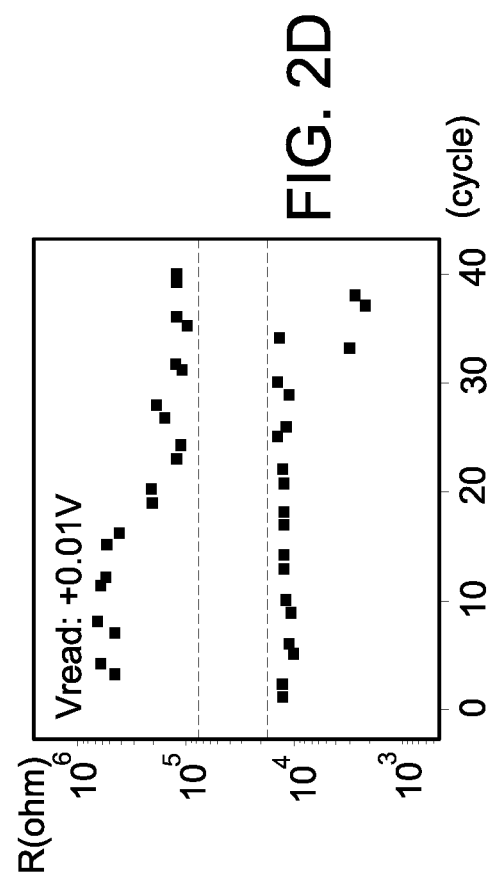

FIG. 2F is an electroluminescence illustrating the relationship between the intensity and the wavelength for the first type light emitting diode memory and the second type light emitting diode memory. For example, the bias current is 50 mA. The intensity of the first type light emitting diode memory (i.e., having the p-type substrate) is about 100 (a.u.), and the wavelength λ of the first type light emitting diode memory is about 600 nm. The intensity of the second type light emitting diode memory (i.e., having the n-type substrate) is about 500 (a.u.), and the wavelength λ of the second type light emitting diode memory is about 575 nm.

FIGS. 3A-3F are plots illustrating the characteristic curves of two light emitting diode memories according to the first embodiment of the present invention, in which the tunneling structure is a stack structure of aluminum oxide (AlO)/gallium oxide (GaO)/aluminum oxide (AlO) and the substrate is an n-type substrate or a p-type substrate layers.

Figure 3A:
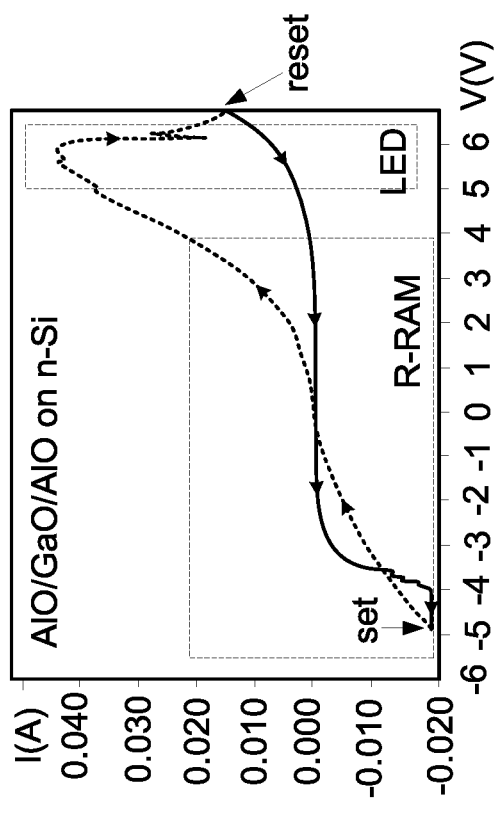
FIGS. 3A-3F are plots illustrating the characteristic curves of two light emitting diode memories according to the first embodiment of the present invention, in which the tunneling structure is a stack structure of aluminum oxide (AlO)/gallium oxide (GaO)/aluminum oxide (AlO) and the substrate is an n-type substrate or a p-type substrate layers.

FIG. 3A schematically illustrates the relationship between the bias voltages and the currents of the third type light emitting diode memory. The tunneling structure 120 is a stack structure comprising the first material layer 121, the second material layer 123 and the third material layer 125. The first material layer 121 is an aluminum oxide (AlO) layer. The second material layer 123 is a gallium oxide (GaO) layer. The third material layer 125 is an aluminum oxide (AlO) layer. The tunneling structure 120 is formed on a p-type substrate 110 along a (100) direction. The thicknesses of the three material layers 121, 123 and 125 are 1.5 nm, 4.5 nm and 1.5 nm, respectively. The current spreading layer 130 is an n-type indium tin oxide (n-ITO) layer.

Please refer to FIG. 3A. When the light emitting diode memory 100 is in the reset state corresponding to the high resistance value and the bias voltage is changed between 0 and −5V, the solid line of FIG. 3A indicates the characteristic curve of the light emitting diode memory 100. When the bias voltage is lower than −5V, the light emitting diode memory 100 is set to be in a set state corresponding to the low resistance value.

When the light emitting diode memory 100 is in the set state and the bias voltage is gradually increased from −5V, the dotted line of FIG. 3A indicates the characteristic curve of the light emitting diode memory 100.

When the bias voltage is higher than +4V, the light emitting diode memory 100 is reset to be in the reset state corresponding to the high resistance value. When the bias voltage is increased to +4V, the light emitting diode memory 100 is turned on to emit a light beam.

When the bias voltage is decreased from +9V to 0V, the characteristic curve of the light emitting diode memory 100 indicates that the light emitting diode memory 100 is maintained in the reset state corresponding to the high resistance value (see the solid line).

Similarly, in case that the bias voltage is decreased to be lower than −5V again, the light emitting diode memory 100 is changed to the set state. That is, when the bias voltage is swept between −5V and +4V, the light emitting diode memory 100 is alternately in the set state and the reset state. In this embodiment, the reverse bias voltage of −5V is a set voltage, and the forward bias voltage of +4V is a reset voltage.

As shown in FIG. 3A, the light emitting diode memory 100 has different resistance values in the voltage range between the −5V and +4V according to the states of the light emitting diode memory 100. Consequently, the light emitting diode memory 100 in the voltage range between the −5V and +4V may be used as a resistive random-access memory (RRAM). In addition, the light emitting diode memory 100 over +4V may be used as a light emitting diode (LED). Moreover, the state of the light emitting diode memory 100 is determined as the set state or the reset state according to a read voltage. The read voltage is in the range between −5V and +4V. For example, the read voltage Vread is +0.01V.

Figure 3B:
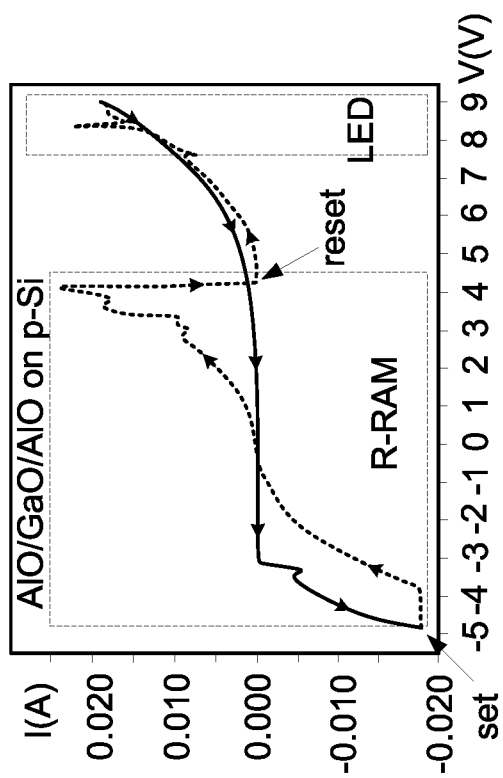

FIG. 3B is a plot illustrating the relationship between the resistance values and the sweeping cycles for the third type light emitting diode memory. Even if the number of cycles of resetting and setting light emitting diode memory 100 is large, the set state and the reset state of the light emitting diode memory 100 can be judged according to the resistance value of the set state and the reset state. As shown in FIG. 3B, the ratio of the resistance value in the reset state to the resistance value in the reset state is larger than about 100.

Figure 3C:
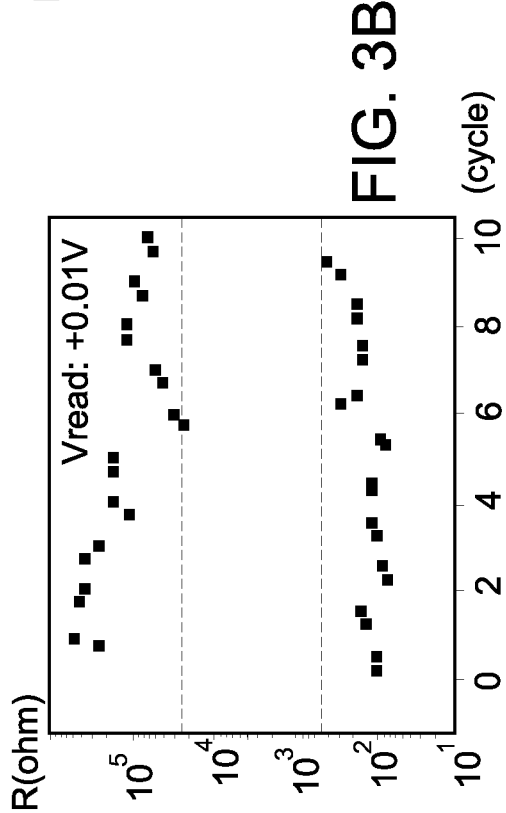

FIG. 3C schematically illustrates the relationship between the bias voltages and the currents of the fourth type light emitting diode memory. The tunneling structure 120 is a stack structure comprising the first material layer 121, the second material layer 123 and the third material layer 125. The first material layer 121 is an aluminum oxide (AlO) layer. The second material layer 123 is a gallium oxide (GaO) layer. The third material layer 125 is an aluminum oxide (AlO) layer. The tunneling structure 120 is formed on an n-type substrate along a (111) direction. The thicknesses of the three material layers 121, 123 and 125 are 1.5 nm, 4.5 nm and 1.5 nm, respectively. The current spreading layer 130 is an n-type indium tin oxide (n-ITO) layer.

During the operation of the second type light emitting diode memory, the contact region between the tunneling structure 120 and the n-type substrate 110 is formed as an inversion layer. Consequently, the n-type substrate 110 has the p-type property.

Please refer to FIG. 3C. When the light emitting diode memory 100 is in the reset state corresponding to the high resistance value and the bias voltage is changed between 0 and −4.5V, the solid line of FIG. 3C indicates the characteristic curve of the light emitting diode memory 100. When the bias voltage is lower than −5V, the light emitting diode memory 100 is set to be in a set state corresponding to the low resistance value.

When the light emitting diode memory 100 is in the set state and the bias voltage is gradually increased from −5V, the dotted line of FIG. 3C indicates the characteristic curve of the light emitting diode memory 100.

When the bias voltage is increased to be higher than +5.5V, the light emitting diode memory 100 is turned on to emit a light beam. When the bias voltage is higher than +7V, the light emitting diode memory 100 is reset to be in the reset state corresponding to the high resistance value.

When the bias voltage is decreased from +7V to 0V, the characteristic curve of the light emitting diode memory 100 indicates that the light emitting diode memory 100 is maintained in the reset state corresponding to the high resistance value (see the solid line).

Similarly, in case that the bias voltage is decreased to be lower than −5V again, the light emitting diode memory 100 is changed to the set state. That is, when the bias voltage is swept between −5V and +7V, the light emitting diode memory 100 is alternately in the set state and the reset state. In this embodiment, the reverse bias voltage of −5V is a set voltage, and the forward bias voltage of +7V is a reset voltage.

As shown in FIG. 3C, the light emitting diode memory 100 has different resistance values in the voltage range between the −5V and +7V according to the states of the light emitting diode memory 100. Consequently, the light emitting diode memory 100 in the voltage range between the −5V and +7V may be used as a resistive random-access memory (RRAM). In addition, the light emitting diode memory 100 over +5.5V may be used as a light emitting diode (LED). Moreover, the state of the light emitting diode memory 100 is determined as the set state or the reset state according to a read voltage. The read voltage Vread is in the range between −5V and +7V. For example, the read voltage is +0.01V.

Figure 3D:
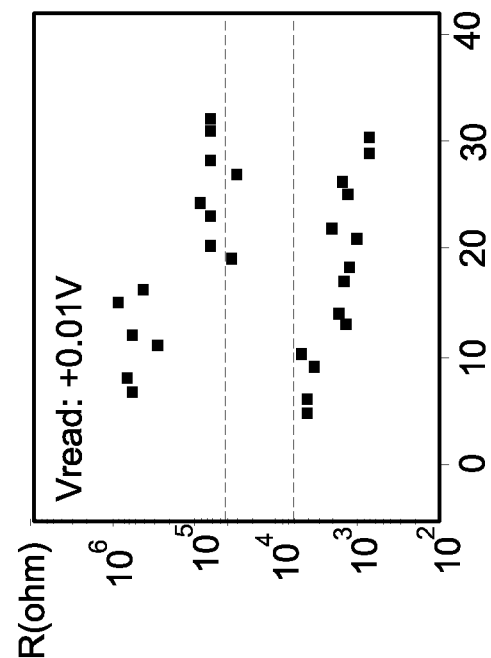

FIG. 3D is a plot illustrating the relationship between the resistance values and the sweeping cycles for the second type light emitting diode memory. Even if the number of cycles of resetting and setting light emitting diode memory 100 is large, the set state and the reset state of the light emitting diode memory 100 can be judged according to the resistance value of the set state and the reset state. As shown in FIG. 3D, the ratio of the resistance value in the reset state to the resistance value in the reset state is larger than about 10.

Figure 3E:
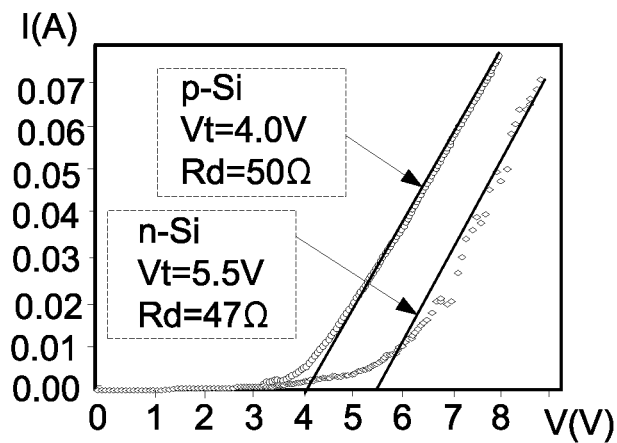

FIG. 3E is a plot illustrating the relationship between the current and the voltage (I-V) for the third type light emitting diode memory and the fourth type light emitting diode memory. The turn-on voltage Vt of the third type light emitting diode memory (i.e., having the p-type substrate) is about 4.0V, and the resistance value Rd of the third type light emitting diode memory is about 50 ohms. The turn-on voltage Vt of the fourth type light emitting diode memory (i.e., having the n-type substrate) is about 5.5V, and the resistance value Rd of the fourth type light emitting diode memory is about 47 ohms.

Figure 3F:
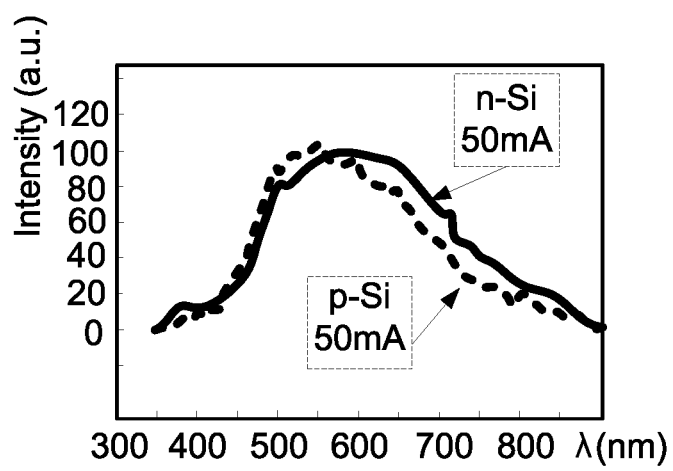

FIG. 3F is an electroluminescence illustrating the relationship between the intensity and the wavelength for the third type light emitting diode memory and the fourth type light emitting diode memory. For example, the bias current is 50 mA. The intensity of the third type light emitting diode memory (i.e., having the p-type substrate) is about 100 (a.u.), and the wavelength λ of the third type light emitting diode memory is about 550 nm. The intensity of the fourth type light emitting diode memory (i.e., having the n-type substrate) is about 100 (a.u.), and the wavelength λ of the fourth type light emitting diode memory is about 600 nm.

FIGS. 4A-4D are plots illustrating the characteristic curves of two light emitting diode memories according to the first embodiment of the present invention, in which the tunneling structure is a stack structure of hafnium oxide ($HFO_2$)/gallium oxide (GaO)/hafnium oxide ($HFO_2$) and the substrate is an n-type substrate or a p-type substrate.

Figure 4B:
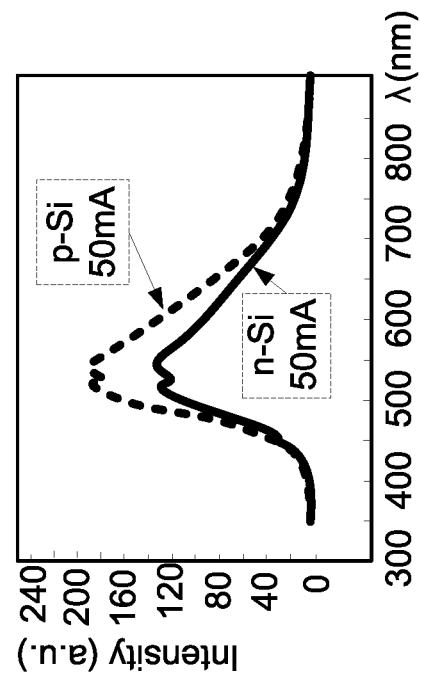
FIGS. 4A-4D are plots illustrating the characteristic curves of two light emitting diode memories according to the first embodiment of the present invention, in which the tunneling structure is a stack structure of hafnium oxide ($HFO_2$)/gallium oxide (GaO)/hafnium oxide ($HFO_2$) and the substrate is an n-type substrate or a p-type substrate.
Figure 4A:
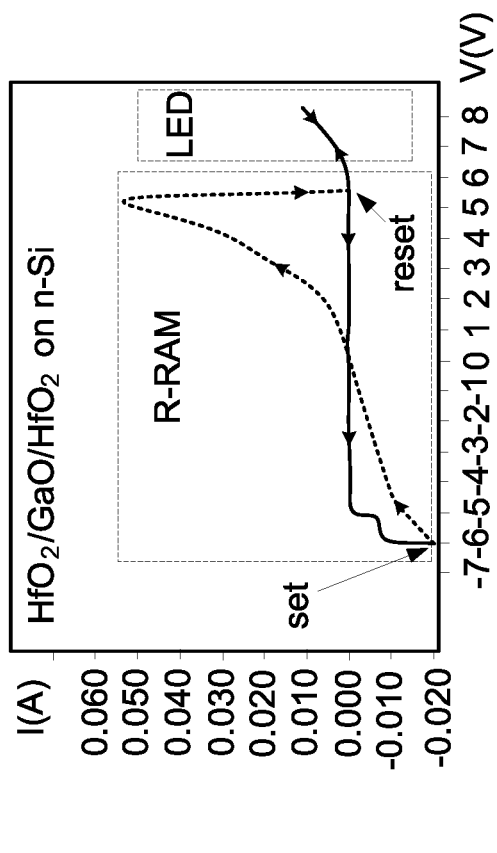

FIG. 4A schematically illustrates the relationship between the bias voltages and the currents of the fifth type light emitting diode memory. The tunneling structure 120 is a stack structure comprising the first material layer 121, the second material layer 123 and the third material layer 125. The first material layer 121 is a hafnium oxide ($HFO_2$) layer. The second material layer 123 is a gallium oxide (GaO) layer. The third material layer 125 is a hafnium oxide ($HFO_2$) layer. The tunneling structure 120 is formed on a p-type substrate 110 along a (100) direction. The thicknesses of the three material layers 121, 123 and 125 are 2 nm, 9 nm and 2 nm, respectively. The current spreading layer 130 is an n-type indium tin oxide (n-ITO) layer.

Please refer to FIG. 4A. When the light emitting diode memory 100 is in the reset state corresponding to the high resistance value and the bias voltage is changed between 0 and −4V, the solid line of FIG. 4A indicates the characteristic curve of the light emitting diode memory 100. When the bias voltage is lower than −4V, the light emitting diode memory 100 is set to be in a set state corresponding to the low resistance value.

When the light emitting diode memory 100 is in the set state and the bias voltage is gradually increased from −4V, the dotted line of FIG. 4A indicates the characteristic curve of the light emitting diode memory 100.

When the bias voltage is increased to +4.4V, the light emitting diode memory 100 is turned on to emit a light beam. When the bias voltage is higher than +5.5V, the light emitting diode memory 100 is reset to be in the reset state corresponding to the high resistance value.

When the bias voltage is decreased from +8V to 0V, the characteristic curve of the light emitting diode memory 100 indicates that the light emitting diode memory 100 is maintained in the reset state corresponding to the high resistance value (see the solid line).

Similarly, in case that the bias voltage is decreased to be lower than −4V again, the light emitting diode memory 100 is changed to the set state. That is, when the bias voltage is swept between −4V and +5.5V, the light emitting diode memory 100 is alternately in the set state and the reset state. In this embodiment, the reverse bias voltage of −4V is a set voltage, and the forward bias voltage of +5.5V is a reset voltage.

As shown in FIG. 4A, the light emitting diode memory 100 has different resistance values in the voltage range between the −4V and +5.5V according to the states of the light emitting diode memory 100. Consequently, the light emitting diode memory 100 in the voltage range between the −4V and +5.5V may be used as a resistive random-access memory (RRAM). In addition, the light emitting diode memory 100 over +4.4V may be used as a light emitting diode (LED). Moreover, the state of the light emitting diode memory 100 is determined as the set state or the reset state according to a read voltage. The read voltage Vread is in the range between −5V and +7V. For example, the read voltage is +0.01V.

FIG. 4B schematically illustrates the relationship between the bias voltages and the currents of the sixth type light emitting diode memory. The tunneling structure 120 is a stack structure comprising the first material layer 121, the second material layer 123 and the third material layer 125. The first material layer 121 is a hafnium oxide ($HFO_2$) layer. The second material layer 123 is a gallium oxide (GaO) layer. The third material layer 125 is a hafnium oxide ($HFO_2$) layer. The tunneling structure 120 is formed on an n-type substrate along a (111) direction. The thicknesses of the three material layers 121, 123 and 125 are 2 nm, 9 nm and 2 nm, respectively. The current spreading layer 130 is an n-type indium tin oxide (n-ITO) layer.

During the operation of the sixth type light emitting diode memory, the contact region between the tunneling structure 120 and the n-type substrate 110 is formed as an inversion layer. Consequently, the n-type substrate 110 has the p-type property.

Please refer to FIG. 4B. When the light emitting diode memory 100 is in the reset state corresponding to the high resistance value and the bias voltage is changed between 0 and −6V, the solid line of FIG. 4B indicates the characteristic curve of the light emitting diode memory 100. When the bias voltage is lower than −6V, the light emitting diode memory 100 is set to be in a set state corresponding to the low resistance value.

When the light emitting diode memory 100 is in the set state and the bias voltage is gradually increased from −6V, the dotted line of FIG. 4B indicates the characteristic curve of the light emitting diode memory 100.

When the bias voltage is increased to be higher than +5.5V, the light emitting diode memory 100 is turned on to emit a light beam. When the bias voltage is higher than +5.5V, the light emitting diode memory 100 is reset to be in the reset state corresponding to the high resistance value.

When the bias voltage is decreased from +8V to 0V, the characteristic curve of the light emitting diode memory 100 indicates that the light emitting diode memory 100 is maintained in the reset state corresponding to the high resistance value (see the solid line).

Similarly, in case that the bias voltage is decreased to be lower than −6V again, the light emitting diode memory 100 is changed to the set state. That is, when the bias voltage is swept between −6V and +5.5V, the light emitting diode memory 100 is alternately in the set state and the reset state. In this embodiment, the reverse bias voltage of −6V is a set voltage, and the forward bias voltage of +5.5V is a reset voltage.

As shown in FIG. 4B, the light emitting diode memory 100 has different resistance values in the voltage range between the −6V and +5.5V according to the states of the light emitting diode memory 100. Consequently, the light emitting diode memory 100 in the voltage range between the −6V and +5.5V may be used as a resistive random-access memory (RRAM). In addition, the light emitting diode memory 100 over +5.5V may be used as a light emitting diode (LED). Moreover, the state of the light emitting diode memory 100 is determined as the set state or the reset state according to a read voltage. The read voltage Vread is in the range between −5V and +7V. For example, the read voltage is +0.01V.

Figure 4D:
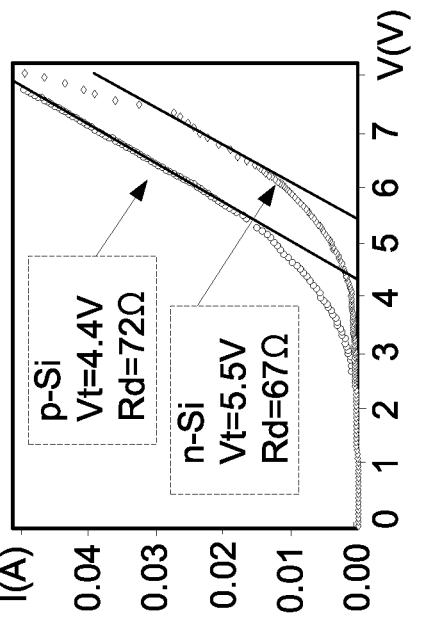
Figure 4C:
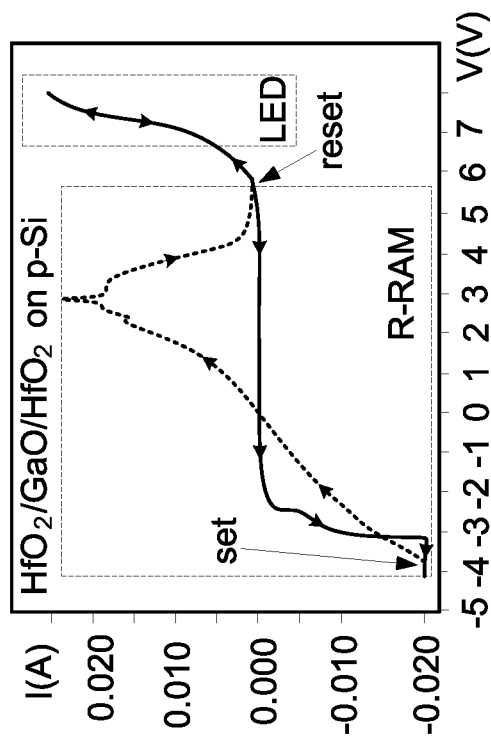

FIG. 4C is a plot illustrating the relationship between the current and the voltage (I-V) for the fifth type light emitting diode memory and the sixth type light emitting diode memory. The turn-on voltage Vt of the fifth type light emitting diode memory (i.e., having the p-type substrate) is about 4.4V, and the resistance value Rd of the fifth type light emitting diode memory is about 72 ohms. The turn-on voltage Vt of the sixth type light emitting diode memory (i.e., having the n-type substrate) is about 5.5V, and the resistance value Rd of the sixth type light emitting diode memory is about 67 ohms.

FIG. 4D is an electroluminescence illustrating the relationship between the intensity and the wavelength for the fifth type light emitting diode memory and the sixth type light emitting diode memory. For example, the bias current is 50 mA. The intensity of the fifth type light emitting diode memory (i.e., having the p-type substrate) is about 180 (a.u.), and the wavelength λ of the fifth type light emitting diode memory is about 525 nm. The intensity of the sixth type light emitting diode memory (i.e., having the n-type substrate) is about 125 (a.u.), and the wavelength λ of the sixth type light emitting diode memory is about 525 nm.

FIGS. 5A-5D are plots illustrating the characteristic curves of two light emitting diode memories according to the first embodiment of the present invention, in which the tunneling structure is a stack structure of hafnium oxide ($HFO_2$)/hafnium nitride (HfN)/hafnium oxide ($HFO_2$) and the substrate is an n-type substrate or a p-type substrate.

FIG. 5A schematically illustrates the relationship between the bias voltages and the currents of the seventh type light emitting diode memory. The tunneling structure 120 is a stack structure comprising the first material layer 121, the second material layer 123 and the third material layer 125. The first material layer 121 is a hafnium oxide ($HFO_2$) layer. The second material layer 123 is a hafnium nitride (HfN) layer. The third material layer 125 is a hafnium oxide ($HFO_2$) layer. The tunneling structure 120 is formed on a p-type substrate 110 along a (100) direction. The thicknesses of the three material layers 121, 123 and 125 are 1.5 nm, 4.5 nm and 1.5 nm, respectively. The current spreading layer 130 is an n-type indium tin oxide (n-ITO) layer.

Please refer to FIG. 5A. When the light emitting diode memory 100 is in the reset state corresponding to the high resistance value and the bias voltage is changed between 0 and −3.5V, the solid line of FIG. 5A indicates the characteristic curve of the light emitting diode memory 100. When the bias voltage is lower than −3.5V, the light emitting diode memory 100 is set to be in a set state corresponding to the low resistance value.

When the light emitting diode memory 100 is in the set state and the bias voltage is gradually increased from −3.5V, the dotted line of FIG. 5A indicates the characteristic curve of the light emitting diode memory 100.

When the bias voltage is increased to +3.0V, the light emitting diode memory 100 is turned on to emit a light beam. When the bias voltage is higher than +4.1V, the light emitting diode memory 100 is reset to be in the reset state corresponding to the high resistance value.

When the bias voltage is decreased from +8V to 0V, the characteristic curve of the light emitting diode memory 100 indicates that the light emitting diode memory 100 is maintained in the reset state corresponding to the high resistance value (see the solid line).

Similarly, in case that the bias voltage is decreased to be lower than −3.5V again, the light emitting diode memory 100 is changed to the set state. That is, when the bias voltage is swept between −3.5V and +3V, the light emitting diode memory 100 is alternately in the set state and the reset state. In this embodiment, the reverse bias voltage of −3.5V is a set voltage, and the forward bias voltage of +3V is a reset voltage.

As shown in FIG. 5A, the light emitting diode memory 100 has different resistance values in the voltage range between the −3.5V and +3V according to the states of the light emitting diode memory 100. Consequently, the light emitting diode memory 100 in the voltage range between the −3.5V and +3V may be used as a resistive random-access memory (RRAM). In addition, the light emitting diode memory 100 over +4.1V may be used as a light emitting diode (LED). Moreover, the state of the light emitting diode memory 100 is determined as the set state or the reset state according to a read voltage. The read voltage Vread is in the range between −3.5V and +3V. For example, the read voltage is +0.01V.

FIG. 5B schematically illustrates the relationship between the bias voltages and the currents of the eighth type light emitting diode memory. The tunneling structure 120 is a stack structure comprising the first material layer 121, the second material layer 123 and the third material layer 125. The first material layer 121 is a hafnium oxide ($HFO_2$) layer. The second material layer 123 is a hafnium nitride (HfN) layer. The third material layer 125 is a hafnium oxide ($HFO_2$) layer. The tunneling structure 120 is formed on an n-type substrate along a (111) direction. The thicknesses of the three material layers 121, 123 and 125 are 1.5 nm, 4.5 nm and 1.5 nm, respectively. The current spreading layer 130 is an n-type indium tin oxide (n-ITO) layer.

During the operation of the eighth type light emitting diode memory, the contact region between the tunneling structure 120 and the n-type substrate 110 is formed as an inversion layer. Consequently, the n-type substrate 110 has the p-type property.

Please refer to FIG. 5B. When the light emitting diode memory 100 is in the reset state corresponding to the high resistance value and the bias voltage is changed between 0 and −7.5V, the solid line of FIG. 5B indicates the characteristic curve of the light emitting diode memory 100. When the bias voltage is lower than −7.5V, the light emitting diode memory 100 is set to be in a set state corresponding to the low resistance value.

When the light emitting diode memory 100 is in the set state and the bias voltage is gradually increased from −7.5V, the dotted line of FIG. 5B indicates the characteristic curve of the light emitting diode memory 100.

When the bias voltage is increased to be higher than +5V, the light emitting diode memory 100 is turned on to emit a light beam. When the bias voltage is higher than +6V, the light emitting diode memory 100 is reset to be in the reset state corresponding to the high resistance value.

When the bias voltage is decreased from +9V to 0V, the characteristic curve of the light emitting diode memory 100 indicates that the light emitting diode memory 100 is maintained in the reset state corresponding to the high resistance value (see the solid line).

Similarly, in case that the bias voltage is decreased to be lower than −7.5V again, the light emitting diode memory 100 is changed to the set state. That is, when the bias voltage is swept between −7.5V and +6V, the light emitting diode memory 100 is alternately in the set state and the reset state.

In this embodiment, the reverse bias voltage of −7.5V is a set voltage, and the forward bias voltage of +6V is a reset voltage.

As shown in FIG. 5B, the light emitting diode memory 100 has different resistance values in the voltage range between the −7.5V and +6V according to the states of the light emitting diode memory 100. Consequently, the light emitting diode memory 100 in the voltage range between the −7.5V and +6V may be used as a resistive random-access memory (RRAM). In addition, the light emitting diode memory 100 over +5V may be used as a light emitting diode (LED). Moreover, the state of the light emitting diode memory 100 is determined as the set state or the reset state according to a read voltage. The read voltage Vread is in the range between −7.5V and +6V. For example, the read voltage is +0.01V.

FIG. 5C is a plot illustrating the relationship between the current and the voltage (I-V) for the seventh type light emitting diode memory and the eighth type light emitting diode memory. The turn-on voltage Vt of the seventh type light emitting diode memory (i.e., having the p-type substrate) is about 4.1V, and the resistance value Rd of the seventh type light emitting diode memory is about 40 ohms. The turn-on voltage Vt of the eighth type light emitting diode memory (i.e., having the n-type substrate) is about 5V, and the resistance value Rd of the eighth type light emitting diode memory is about 51 ohms.

FIG. 5D is an electroluminescence illustrating the relationship between the intensity and the wavelength for the seventh type light emitting diode memory and the eighth type light emitting diode memory. For example, the bias current is 50 mA. The intensity of the seventh type light emitting diode memory (i.e., having the p-type substrate) is about 280 (a.u.), and the wavelength λ of the seventh type light emitting diode memory is about 600 nm. The intensity of the eighth type light emitting diode memory (i.e., having the n-type substrate) is about 140 (a.u.), and the wavelength λ of the eighth type light emitting diode memory is about 650 nm.

Figure 6:
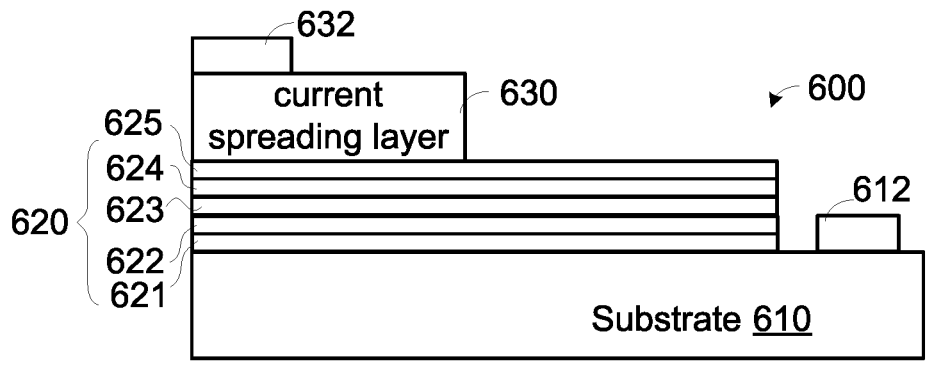
FIG. 6 is a schematic cross-sectional view illustrating a light emitting diode memory according to a second embodiment of the present invention.

FIG. 6 is a schematic cross-sectional view illustrating a light emitting diode memory according to a second embodiment of the present invention. The light emitting diode memory 600 comprises a substrate 610, a tunneling structure 620 and a current spreading layer 630. The light emitting diode memory 100 further comprises electrode layers 612 and 632. The electrode layer 612 and the substrate 610 are in ohmic contact with each other. The electrode layer 632 and the current spreading layer 630 are in ohmic contact with each other.

The tunneling structure 620 is a stack structure comprising a first material layer 621, a second material layer 622, a third material layer 623, a fourth material layer 624 and a fifth material layer 625. The first material layer 621, the third material layer 623 and the fifth material layer 625 are barrier layers. The second material layer 622 and the fourth material layer 624 are quantum well layers.

In this embodiment, the substrate 610 is an n-type substrate or a p-type substrate. Moreover, the materials of the first material layer 621, the second material layer 622, the third material layer 623, the fourth material layer 624 and the fifth material layer 625 may be different.

FIGS. 7A-7F are plots illustrating the characteristic curves of two light emitting diode memories according to the first embodiment of the present invention, in which the tunneling structure is a stack structure of aluminum oxide (AlO)/gallium oxide (GaO)/aluminum oxide (AlO)/gallium oxide (GaO)/aluminum oxide (AlO) and the substrate is an n-type substrate or a p-type substrate.

Figure 7A:
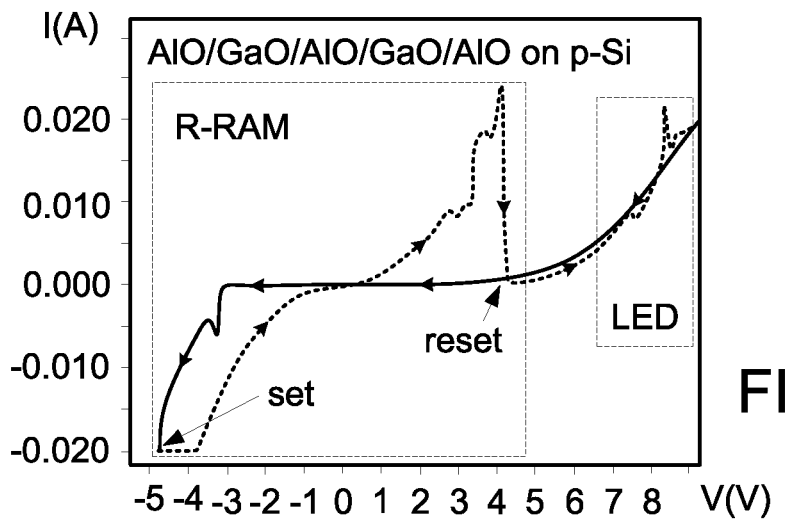
FIGS. 7A-7F are plots illustrating the characteristic curves of two light emitting diode memories according to the first embodiment of the present invention, in which the tunneling structure is a stack structure of aluminum oxide (AlO)/gallium oxide (GaO)/aluminum oxide (AlO)/gallium oxide (GaO)/aluminum oxide (AlO) and the substrate is an n-type substrate or a p-type substrate.

FIG. 7A schematically illustrates the relationship between the bias voltages and the currents of the ninth type light emitting diode memory. The tunneling structure 620 is a stack structure comprising the first material layer 621, the second material layer 622, the third material layer 623, the fourth material layer 624 and the fifth material layer 625. The first material layer 621 is an aluminum oxide (AlO) layer. The second material layer 622 is a gallium oxide (GaO) layer. The third material layer 623 is an aluminum oxide (AlO) layer. The fourth material layer 624 is a gallium oxide (GaO) layer. The fifth material layer 625 is an aluminum oxide (AlO) layer. The tunneling structure 620 is formed on a p-type substrate 610 along a (100) direction. The thicknesses of the three material layers 621, 622, 623, 624 and 625 are 2 nm, 18 nm, 2 nm, 12 nm and 2 nm, respectively. The current spreading layer 630 is an n-type indium tin oxide (n-ITO) layer.

Please refer to FIG. 7A. When the light emitting diode memory 600 is in the reset state corresponding to the high resistance value and the bias voltage is changed between 0 and −5V, the solid line of FIG. 7A indicates the characteristic curve of the light emitting diode memory 600. When the bias voltage is lower than −5V, the light emitting diode memory 600 is set to be in a set state corresponding to the low resistance value.

When the light emitting diode memory 600 is in the set state and the bias voltage is gradually increased from −5V, the dotted line of FIG. 7A indicates the characteristic curve of the light emitting diode memory 600.

When the bias voltage is higher than +4V, the light emitting diode memory 600 is reset to be in the reset state corresponding to the high resistance value. When the bias voltage is increased to +5.7V, the light emitting diode memory 600 is turned on to emit a light beam.

When the bias voltage is decreased from +9V to 0V, the characteristic curve of the light emitting diode memory 600 indicates that the light emitting diode memory 600 is maintained in the reset state corresponding to the high resistance value (see the solid line).

Similarly, in case that the bias voltage is decreased to be lower than −5V again, the light emitting diode memory 600 is changed to be in the set state. That is, when the bias voltage is swept between −5V and +4V, the light emitting diode memory 600 is alternately in the set state and the reset state. In this embodiment, the reverse bias voltage of −5V is a set voltage, and the forward bias voltage of +4V is a reset voltage.

As shown in FIG. 7A, the light emitting diode memory 600 has different resistance values in the voltage range between the −5V and +4V according to the states of the light emitting diode memory 600. Consequently, the light emitting diode memory 600 in the voltage range between the −5V and +4V may be used as a resistive random-access memory (RRAM). In addition, the light emitting diode memory 600 over +5.7V may be used as a light emitting diode (LED). Moreover, the state of the light emitting diode memory 600 is determined as the set state or the reset state according to a read voltage. The read voltage Vread is in the range between −5V and +4V. For example, the read voltage is +0.01V.

Figure 7B:
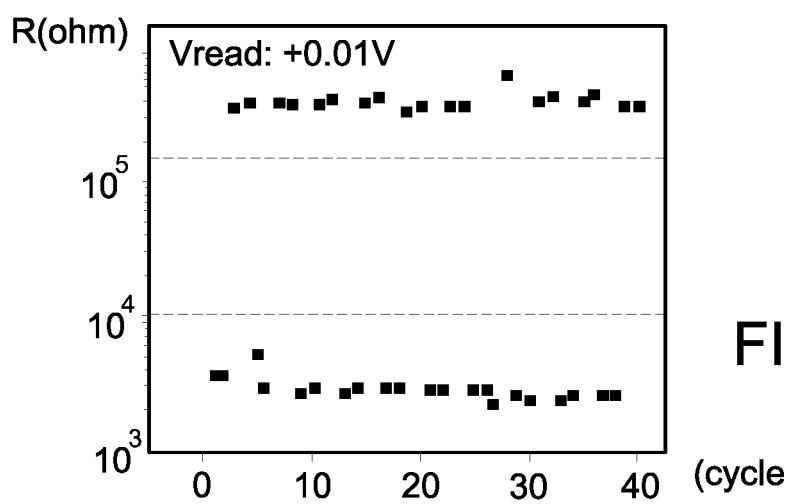

FIG. 7B is a plot illustrating the relationship between the resistance values and the sweeping cycles for the ninth type light emitting diode memory. Even if the number of cycles of resetting and setting light emitting diode memory 600 is large, the set state and the reset state of the light emitting diode memory 600 can be judged according to the resistance value of the set state and the reset state. As shown in FIG. 7B, the ratio of the resistance value in the reset state to the resistance value in the reset state is larger than about 100.

Figure 7E:
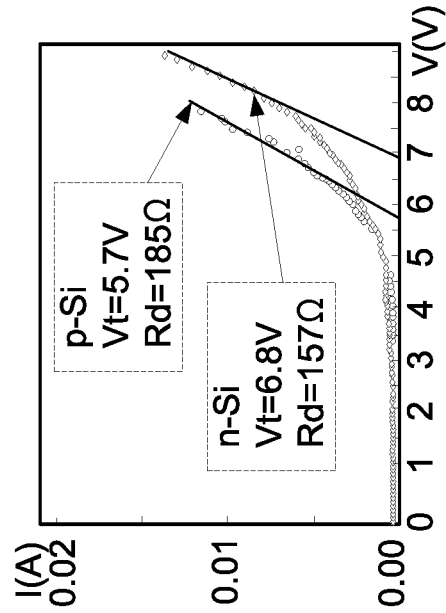
Figure 7F:
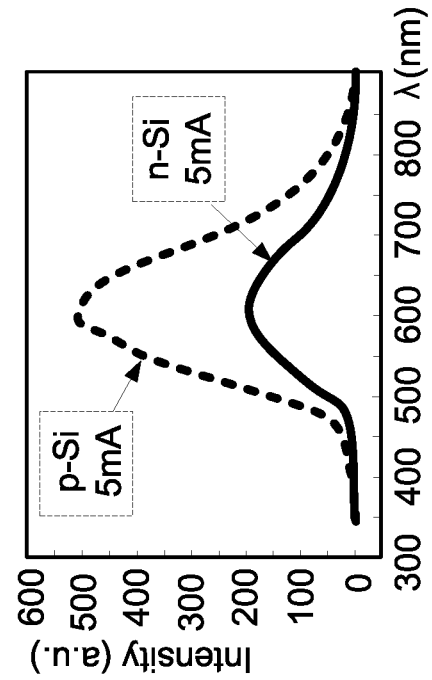
Figure 7C:
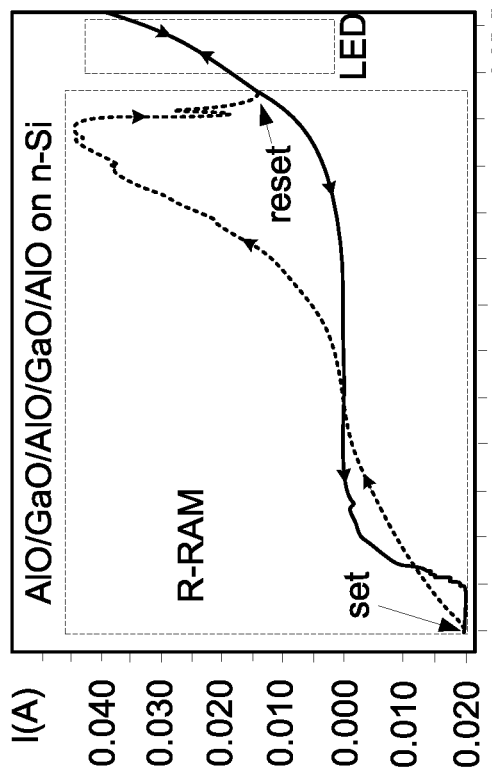

FIG. 7C schematically illustrates the relationship between the bias voltages and the currents of the tenth type light emitting diode memory. The tunneling structure 620 is a stack structure comprising the first material layer 621, the second material layer 622, the third material layer 623, the fourth material layer 624 and the fifth material layer 625. The first material layer 621 is an aluminum oxide (AlO) layer. The second material layer 622 is a gallium oxide (GaO) layer. The third material layer 623 is an aluminum oxide (AlO) layer. The fourth material layer 624 is a gallium oxide (GaO) layer. The fifth material layer 625 is an aluminum oxide (AlO) layer. The tunneling structure 620 is formed on an n-type substrate 610 along a (111) direction. The thicknesses of the three material layers 621, 622, 623, 624 and 625 are 2 nm, 18 nm, 2 nm, 12 nm and 2 nm, respectively. The current spreading layer 630 is an n-type indium tin oxide (n-ITO) layer.

During the operation of the second type light emitting diode memory, the contact region between the tunneling structure 620 and the n-type substrate 610 is formed as an inversion layer. Consequently, the n-type substrate 610 has the p-type property.

Please refer to FIG. 7C. When the light emitting diode memory 600 is in the reset state corresponding to the high resistance value and the bias voltage is changed between 0 and −5V, the solid line of FIG. 7C indicates the characteristic curve of the light emitting diode memory 600. When the bias voltage is lower than −5V, the light emitting diode memory 600 is set to be in a set state corresponding to the low resistance value.

When the light emitting diode memory 600 is in the set state and the bias voltage is gradually increased from −5V, the dotted line of FIG. 7C indicates the characteristic curve of the light emitting diode memory 600.

When the bias voltage is increased to be higher than +6.5V, the light emitting diode memory 600 is reset to be in the reset state corresponding to the high resistance value. When the bias voltage is higher than +6.8V, the light emitting diode memory 600 is turned on to emit a light beam.

When the bias voltage is decreased from +8V to 0V, the characteristic curve of the light emitting diode memory 600 indicates that the light emitting diode memory 600 is maintained in the reset state corresponding to the high resistance value (see the solid line).

Similarly, in case that the bias voltage is decreased to be lower than −5V again, the light emitting diode memory 600 is changed to the set state. That is, when the bias voltage is swept between −5V and +6.5V, the light emitting diode memory 600 is alternately in the set state and the reset state. In this embodiment, the reverse bias voltage of −5V is a set voltage, and the forward bias voltage of +6.5V is a reset voltage.

As shown in FIG. 7C, the light emitting diode memory 600 has different resistance values in the voltage range between the −5V and +6.5V according to the states of the light emitting diode memory 600. Consequently, the light emitting diode memory 600 in the voltage range between the −5V and +6.5V may be used as a resistive random-access memory (RRAM). In addition, the light emitting diode memory 600 over +6.8V may be used as a light emitting diode (LED). The read voltage is in the range between −5V and +6.5V. For example, the read voltage Vread is +0.01V.

Figure 7D:
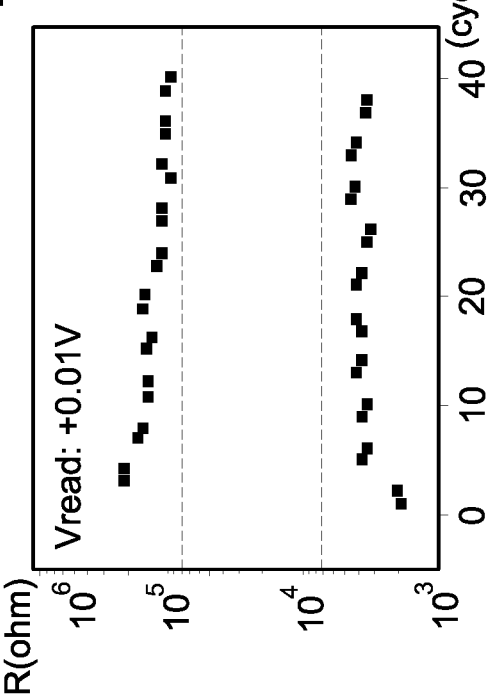

FIG. 7D is a plot illustrating the relationship between the resistance values and the sweeping cycles for the tenth type light emitting diode memory. Even if the number of cycles of resetting and setting light emitting diode memory 600 is large, the set state and the reset state of the light emitting diode memory 600 can be judged according to the resistance value of the set state and the reset state. As shown in FIG. 7D, the ratio of the resistance value in the reset state to the resistance value in the reset state is larger than about 100.

FIG. 7E is a plot illustrating the relationship between the current and the voltage (I-V) for the ninth type light emitting diode memory and the tenth type light emitting diode memory. The turn-on voltage Vt of the ninth type light emitting diode memory (i.e., having the p-type substrate) is about 5.7V, and the resistance value Rd of the ninth type light emitting diode memory is about 185 ohms. The turn-on voltage Vt of the tenth type light emitting diode memory (i.e., having the n-type substrate) is about 6.8V, and the resistance value Rd of the tenth type light emitting diode memory is about 157 ohms.

FIG. 7F is an electroluminescence illustrating the relationship between the intensity and the wavelength for the ninth type light emitting diode memory and the tenth type light emitting diode memory. For example, the bias current is 50 mA. The intensity of the ninth type light emitting diode memory (i.e., having the p-type substrate) is about 500 (a.u.), and the wavelength λ of the ninth type light emitting diode memory is about 600 nm. The intensity of the tenth type light emitting diode memory (i.e., having the n-type substrate) is about 150 (a.u.), and the wavelength λ of the tenth type light emitting diode memory is about 600 nm.

Figure 8:
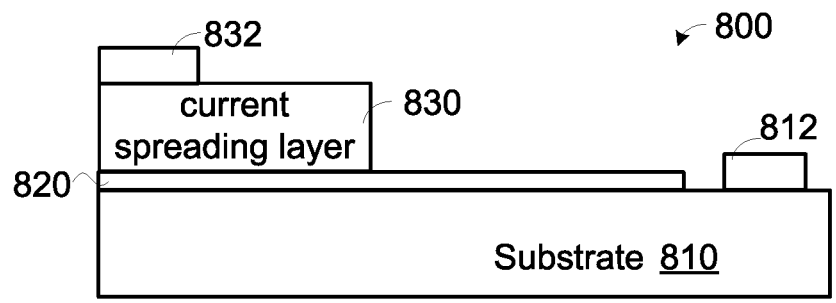
FIG. 8 is a schematic cross-sectional view illustrating a light emitting diode memory according to a third embodiment of the present invention.

FIG. 8 is a schematic cross-sectional view illustrating a light emitting diode memory according to a third embodiment of the present invention. The light emitting diode memory 800 comprises a substrate 810, an active layer 820 and a current spreading layer 830. The light emitting diode memory 800 further comprises electrode layers 812 and 832. The electrode layer 812 and the substrate 810 are in ohmic contact with each other. The electrode layer 832 and the current spreading layer 830 are in ohmic contact with each other.

In this embodiment, the substrate 810 is an n-type substrate or a p-type substrate. The active layer 820 is formed by performing a nitriding treatment of the zinc oxide (ZnO). The thickness of the active layer 820 is 100 nm. After the zinc oxide (ZnO) layer is placed in the atmosphere of ammonia (NH3) at 600° C. for 0.5 hour, the nitrided zinc oxide (ZnO) layer is formed.

FIGS. 9A-9D are plots illustrating the characteristic curves of two light emitting diode memories according to the third embodiment of the present invention, in which the active layer is a zinc oxide (ZnO) layer and the substrate is an n-type substrate or a p-type substrate.

Figure 9A:
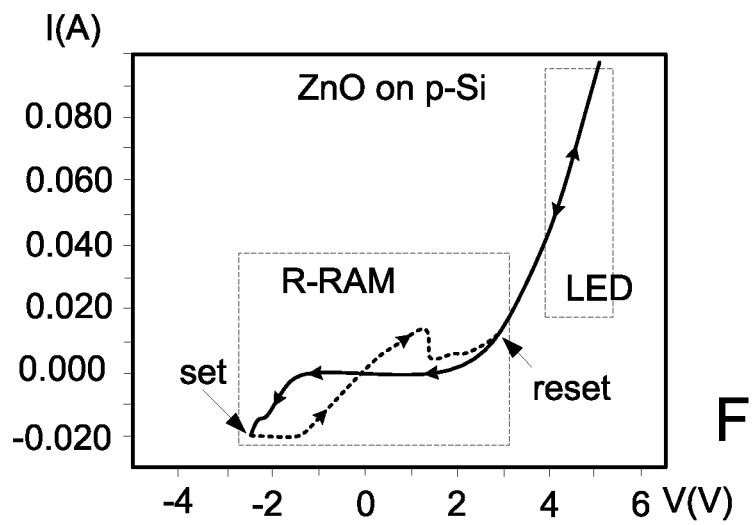
FIGS. 9A-9D are plots illustrating the characteristic curves of two light emitting diode memories according to the third embodiment of the present invention, in which the active layer is a zinc oxide (ZnO) layer and the substrate is an n-type substrate or a p-type substrate.

FIG. 9A schematically illustrates the relationship between the bias voltages and the currents of the eleventh type light emitting diode memory. The active layer 820 is a zinc oxide (ZnO) layer, which is formed on a p-type substrate 810. The current spreading layer 830 is an n-type indium tin oxide (n-ITO) layer.

Please refer to FIG. 9A. When the light emitting diode memory 800 is in the reset state corresponding to the high resistance value and the bias voltage is changed between 0 and −3V, the solid line of FIG. 9A indicates the characteristic curve of the light emitting diode memory 800. When the bias voltage is lower than −3V, the light emitting diode memory 800 is set to be in a set state corresponding to the low resistance value.

When the light emitting diode memory 800 is in the set state and the bias voltage is gradually increased from −3V, the dotted line of FIG. 9A indicates the characteristic curve of the light emitting diode memory 800.

When the bias voltage is higher than +2V, the light emitting diode memory 800 is reset to be in the reset state corresponding to the high resistance value. When the bias voltage is increased to +2.8V, the light emitting diode memory 800 is turned on to emit a light beam.

When the bias voltage is decreased from +5V to 0V, the characteristic curve of the light emitting diode memory 800 indicates that the light emitting diode memory 800 is maintained in the reset state corresponding to the high resistance value (see the solid line).

Similarly, in case that the bias voltage is decreased to be lower than −3V again, the light emitting diode memory 800 is changed to the set state. That is, when the bias voltage is swept between −3V and +2V, the light emitting diode memory 800 is alternately in the set state and the reset state. In this embodiment, the reverse bias voltage of −3V is a set voltage, and the forward bias voltage of +2V is a reset voltage.

As shown in FIG. 9A, the light emitting diode memory 800 has different resistance values in the voltage range between the −3V and +2V according to the states of the light emitting diode memory 800. Consequently, the light emitting diode memory 800 in the voltage range between the −3V and +2V may be used as a resistive random-access memory (RRAM). In addition, the light emitting diode memory 800 over +2.8V may be used as a light emitting diode (LED). Moreover, the state of the light emitting diode memory 800 is determined as the set state or the reset state according to a read voltage. The read voltage Vread is in the range between −3V and +2V. For example, the read voltage is +0.01V.

Figure 9B:
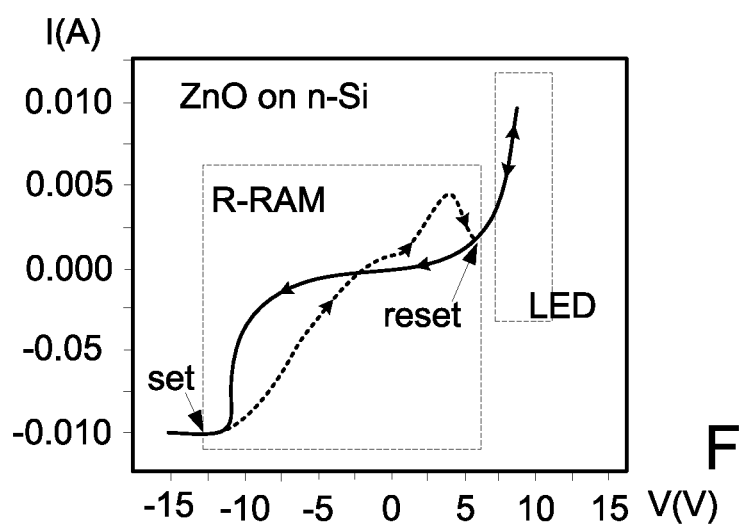

FIG. 9B schematically illustrates the relationship between the bias voltages and the currents of the twelfth type light emitting diode memory. The active layer 820 is a zinc oxide (ZnO) layer, which is formed on an n-type substrate 810. The current spreading layer 830 is an n-type indium tin oxide (n-ITO) layer.

During the operation of the twelfth type light emitting diode memory 800, the contact region between the active layer 820 and the n-type substrate 810 is formed as an inversion layer. Consequently, the n-type substrate 810 has the p-type property.

Please refer to FIG. 9B. When the light emitting diode memory 800 is in the reset state corresponding to the high resistance value and the bias voltage is changed between 0 and −12.5V, the solid line of FIG. 9B indicates the characteristic curve of the light emitting diode memory 800. When the bias voltage is lower than −6V, the light emitting diode memory 800 is set to be in a set state corresponding to the low resistance value.

When the light emitting diode memory 800 is in the set state and the bias voltage is gradually increased from −12.5V, the dotted line of FIG. 9B indicates the characteristic curve of the light emitting diode memory 800.

When the bias voltage is increased to be higher than +3.9V, the light emitting diode memory 800 is turned on to emit a light beam. When the bias voltage is higher than +6V, the light emitting diode memory 800 is reset to be in the reset state corresponding to the high resistance value.

When the bias voltage is decreased from +10V to 0V, the characteristic curve of the light emitting diode memory 800 indicates that the light emitting diode memory 800 is maintained in the reset state corresponding to the high resistance value (see the solid line).

Similarly, in case that the bias voltage is decreased to be lower than −12.5V again, the light emitting diode memory 800 is changed to the set state. That is, when the bias voltage is swept between −12.5V and +6V, the light emitting diode memory 800 is alternately in the set state and the reset state. In this embodiment, the reverse bias voltage of −12.5V is a set voltage, and the forward bias voltage of +6V is a reset voltage.

As shown in FIG. 9B, the light emitting diode memory 800 has different resistance values in the voltage range between the −12.5V and +6V according to the states of the light emitting diode memory 800. Consequently, the light emitting diode memory 800 in the voltage range between the −6V and +5.5V may be used as a resistive random-access memory (RRAM). In addition, the light emitting diode memory 800 over +3.9V may be used as a light emitting diode (LED). Moreover, the state of the light emitting diode memory 800 is determined as the set state or the reset state according to a read voltage. The read voltage Vread is in the range between −12.5V and +6V. For example, the read voltage is +0.01V.

Figure 9C:
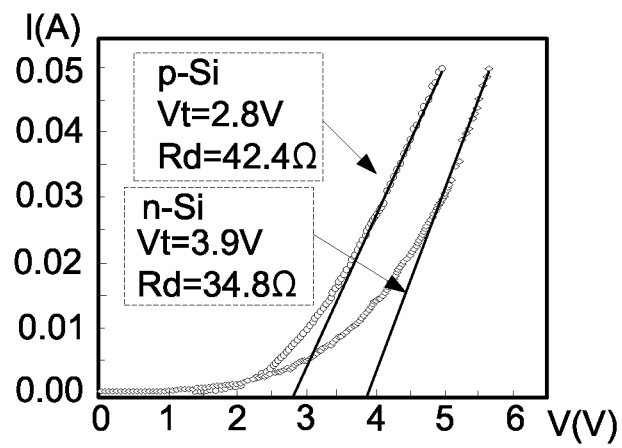

FIG. 9C is a plot illustrating the relationship between the current and the voltage (I-V) for the eleventh type light emitting diode memory and the twelfth type light emitting diode memory. The turn-on voltage Vt of the eleventh type light emitting diode memory (i.e., having the p-type substrate) is about 2.8V, and the resistance value Rd of the eleventh type light emitting diode memory is about 42.4 ohms. The turn-on voltage Vt of the twelfth type light emitting diode memory (i.e., having the n-type substrate) is about 3.9V, and the resistance value Rd of the twelfth type light emitting diode memory is about 34.8 ohms.

Figure 9D:
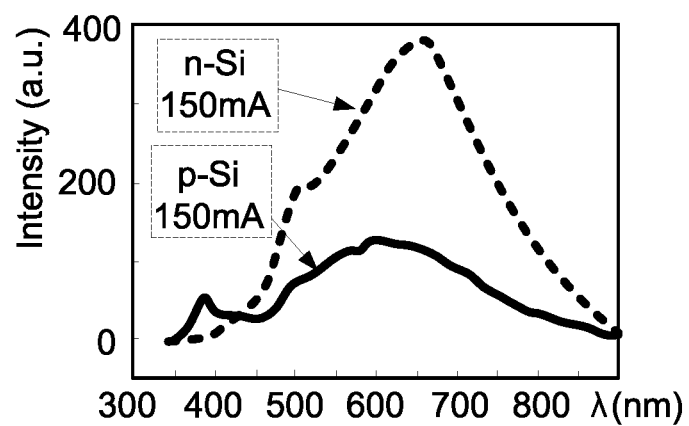

FIG. 9D is an electroluminescence illustrating the relationship between the intensity and the wavelength for the eleventh type light emitting diode memory and the twelfth type light emitting diode memory. For example, the bias current is 50 mA. The intensity of the eleventh type light emitting diode memory (i.e., having the p-type substrate) is about 100 (a.u.), and the wavelength λ of the eleventh type light emitting diode memory is about 600 nm. The intensity of the twelfth type light emitting diode memory (i.e., having the n-type substrate) is about 390 (a.u.), and the wavelength λ of the twelfth type light emitting diode memory is about 670 nm.

From the above descriptions, the present invention provides a light emitting diode memory with a novel structure. The light emitting diode memory is set to be in the set state corresponding to the low resistance value according to the set voltage. The light emitting diode memory is reset to be in the reset state corresponding to the high resistance value according to the reset voltage.

Moreover, the read voltage is provided as the bias voltage. The state of the light emitting diode memory is determined as the set state or the reset state according to the magnitude of the current generated by the light emitting diode memory.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A light emitting diode memory, comprising:
a substrate;
a tunneling structure formed on the substrate, wherein the tunneling structure is a stack structure comprising a first material layer, a second material layer and a third material layer;
a current spreading layer formed on the tunneling structure;
a first electrode layer formed on the substrate; and
a second electrode layer formed on the current spreading layer,
wherein the first material layer is made of hafnium oxide, the second material layer is made of zinc oxide, and the third material layer is made of hafnium oxide; and
wherein when a bias voltage applied to the first electrode layer and the second electrode layer is higher than a reset voltage, the light emitting diode memory is in a reset state, wherein when the bias voltage is lower than a set voltage, the light emitting diode memory is in a set state, wherein when the bias voltage is higher than a turn-on voltage, the light emitting diode memory emits a light beam.

2. The light emitting diode memory as claimed in claim 1, wherein the substrate is an n-type substrate or a p-type substrate, and the current spreading layer is an n-type indium tin oxide layer.

3. A light emitting diode memory, comprising:
a substrate;
a tunneling structure formed on the substrate, wherein the tunneling structure is a stack structure comprising a first material layer, a second material layer and a third material layer;
a current spreading layer formed on the tunneling structure;
a first electrode layer formed on the substrate; and
a second electrode layer formed on the current spreading layer,
wherein the first material layer is made of aluminum oxide, the second material layer is made of gallium oxide, and the third material layer is made of aluminum oxide; and
wherein when a bias voltage applied to the first electrode layer and the second electrode layer is higher than a reset voltage, the light emitting diode memory is in a reset state, wherein when the bias voltage is lower than a set voltage, the light emitting diode memory is in a set state, wherein when the bias voltage is higher than a turn-on voltage, the light emitting diode memory emits a light beam.

4. A light emitting diode memory, comprising:
a substrate;
a tunneling structure formed on the substrate, wherein the tunneling structure is a stack structure comprising a first material layer, a second material layer and a third material layer;
a current spreading layer formed on the tunneling structure;
a first electrode layer formed on the substrate; and
a second electrode layer formed on the current spreading layer,
wherein the first material layer is made of hafnium oxide, the second material layer is made of gallium oxide, and the third material layer is made of hafnium oxide; and
wherein when a bias voltage applied to the first electrode layer and the second electrode layer is higher than a reset voltage, the light emitting diode memory is in a reset state, wherein when the bias voltage is lower than a set voltage, the light emitting diode memory is in a set state, wherein when the bias voltage is higher than a turn-on voltage, the light emitting diode memory emits a light beam.

5. A light emitting diode memory, comprising:
a substrate;
a tunneling structure formed on the substrate, wherein the tunneling structure is a stack structure comprising a first material layer, a second material layer and a third material layer;
a current spreading layer formed on the tunneling structure;
a first electrode layer formed on the substrate; and
a second electrode layer formed on the current spreading layer,
wherein the first material layer is made of hafnium oxide, the second material layer is made of hafnium nitride, and the third material layer is made of hafnium oxide; and
wherein when a bias voltage applied to the first electrode layer and the second electrode layer is higher than a reset voltage, the light emitting diode memory is in a reset state, wherein when the bias voltage is lower than a set voltage, the light emitting diode memory is in a set state, wherein when the bias voltage is higher than a turn-on voltage, the light emitting diode memory emits a light beam.

6. A light emitting diode memory, comprising:
a substrate;
a tunneling structure formed on the substrate, wherein the tunneling structure is a stack structure comprising a first material layer, a second material layer, a third material layer, a fourth material layer and a fifth material layer;
a current spreading layer formed on the tunneling structure;
a first electrode layer formed on the substrate; and
a second electrode layer formed on the current spreading layer,
wherein the first material layer is made of aluminum oxide, the second material layer is made of gallium oxide, the third material layer is made of aluminum oxide, the fourth material layer is made of gallium oxide, and the fifth material layer is made of aluminum oxide; and
wherein when a bias voltage applied to the first electrode layer and the second electrode layer is higher than a reset voltage, the light emitting diode memory is in a reset state, wherein when the bias voltage is lower than a set voltage, the light emitting diode memory is in a set state, wherein when the bias voltage is higher than a turn-on voltage, the light emitting diode memory emits a light beam.

7. The light emitting diode memory as claimed in claim 6, wherein the substrate is an n-type substrate or a p-type substrate, and the current spreading layer is an n-type indium tin oxide layer.

8. A light emitting diode memory, comprising:
a substrate;
an active layer formed on the substrate, wherein the active layer is a zinc oxide layer;
a current spreading layer formed on the active layer;
a first electrode layer formed on the substrate; and
a second electrode layer formed on the current spreading layer, wherein when a bias voltage applied to the first electrode layer and the second electrode layer is higher than a reset voltage, the light emitting diode memory is in a reset state, wherein when the bias voltage is lower than a set voltage, the light emitting diode memory is in a set state, wherein when the bias voltage is higher than a turn-on voltage, the light emitting diode memory emits a light beam.

9. The light emitting diode memory as claimed in claim 8, wherein the substrate is an n-type substrate or a p-type substrate, and the current spreading layer is an n-type indium tin oxide layer.

10. The light emitting diode memory as claimed in claim 8, wherein the zinc oxide layer is a nitrided zinc oxide.

* * * * *